(12) United States Patent
Kusaka

(10) Patent No.: US 6,479,762 B2
(45) Date of Patent: Nov. 12, 2002

(54) PRINTED CIRCUIT BOARD HAVING A PATTERN OF TRACES FORMED BY SCREEN-PRINTING

(75) Inventor: Akihiro Kusaka, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/993,437

(22) Filed: Nov. 13, 2001

(65) Prior Publication Data

US 2002/0061388 A1 May 23, 2002

(30) Foreign Application Priority Data

Nov. 20, 2000 (JP) ........................................ 2000-357612

(51) Int. Cl.[7] .............................. H01R 9/09; H01B 7/00
(52) U.S. Cl. .............. 174/261; 174/117 F; 174/117 FF; 174/254
(58) Field of Search ........................ 174/117 F, 117 FF, 174/254, 261

(56) References Cited

U.S. PATENT DOCUMENTS

| | | | | |
|---|---|---|---|---|
| 4,880,943 A | * | 11/1989 | Kuzuno et al. | ................ 174/72 |
| 5,005,105 A | * | 4/1991 | Onodera | ...................... 361/398 |
| 5,598,627 A | * | 2/1997 | Saka et al. | ...................... 29/861 |
| 5,777,855 A | * | 7/1998 | Yokajty | ........................ 361/803 |
| 5,834,704 A | * | 11/1998 | Tanaka | ......................... 174/254 |
| 6,001,489 A | | 12/1999 | Miyaake et al. | |

* cited by examiner

Primary Examiner—Cathy Lam
(74) Attorney, Agent, or Firm—Beyer Weaver & Thomas

(57) ABSTRACT

A reliable printed circuit board is provided, which has breaks reduced at a bent portion of the trace patterns. The printed circuit board is provided with the trace patterns with the bent portion that is wider in pattern width than the trace portions located near both ends of the bent portion. This allows a more area to remain on the bent portion than on the prior-art bent portion and thereby provides a highly reliable trace pattern without causing a break thereon even when a patchy portion or the like is produced by printing at the bent portion.

3 Claims, 3 Drawing Sheets

PRINTED CIRCUIT BOARD HAVING A PATTERN OF TRACES FORMED BY SCREEN-PRINTING

BACKGROUND OF THE INVENTION

1. Field of the Invention

The present invention relates to a printed circuit board that is preferably used for electronic devices such as video cameras.

2. Description of the Related Art

The structure of a prior-art printed circuit board is described below with reference to FIGS. 4 and 5. In the figures, an insulating board 21 formed of a flexible material has a rectangular base portion 22 comprising stationary contacts (not shown in any figures) and a leading portion 23 formed generally in the shape of a letter "L" in its entirety.

The leading portion 23 may be formed generally in the shape of a letter "L" in order to avoid contacting with electric parts (not shown in any figures) provided in the electric device, mounting members (not shown in any figures) or the like. The leading portion 23 is provided with a curved portion 23a bent in the shape of a letter "L", cable portions 23b connected to both sides of the curved portion 23a and formed to be the same as the curved portion 23a in width, and a delivery portion 23c provided at an end of the cable portion 23b.

A plurality of trace patterns 24 formed of silver each have a bent portion 24a bent in the shape of a letter "L", straight trace portions 24b connected to both ends of the bent portion 24a and having the same pattern width as that of the bent portion 24a, and a straight connecting portion 24c provided at an end of the trace portion 24b.

The trace patterns 24 are formed on the leading portion 23 by screen-printing in parallel to each other, with the bent portion 24a disposed at the curved portion 23a of the leading portion 23 of the insulating board 21, the trace portion 24b disposed at the cable portion 23b and the base portion 22, and the connecting portion 24c disposed at the delivery portion 23c, respectively.

The trace portion 24b formed on the base portion 22 is connected to the stationary contacts (not shown in any figures) formed on the base portion 22 as an electrically conductive pattern.

The printed circuit board fabricated as such allows the connecting portion 24c provided at the delivery portion 23c to be connected with a connector (not shown in any figures), being adapted that an external current flows into the printed circuit board through the connecting portion 24c or a current from the printed circuit board is delivered outwardly through the connecting portion 24c.

To this end, the connecting portion 24c is a critical one and therefore a high accuracy is required of the screen-printing at the connecting portion 24c.

A prior-art method for fabricating a printed circuit board by means of screen-printing is implemented as shown in FIG. 6. That is, the insulating board 21 is placed and held on a mounting stage 25, and thereafter a meshed print mask 26 is placed on the insulating board 21.

Then, silver paste 27 is applied to the print mask 26, and thereafter a squeezer 28 is moved in the direction indicated by arrow A to form a plurality of trace patterns 24 by printing on the insulating board 21.

That is, in FIGS. 4 and 5, the squeezer 28 is to move along the arrow A.

At this time, the connecting portion 24c is first formed by means of printing, then the trace portion 24b is printed, and thereafter the bent portion 24a is formed by means of printing.

On the other hand, at the time of this printing, the delivery portion 23c of the leading portion 23 is located closer to the initial position of the squeezer 28. In addition to this, the connecting portion 24c or part of the trace pattern 24, formed in the shape of a straight pattern, is printed in a manner such that the squeezer 28 is to move in the direction of this straight pattern.

In other words, the squeezer 28 is moved in the direction of the straight pattern. This makes it possible to considerably reduce patchy portions of the silver paste 27 and thereby provide highly accurate printing at the connecting portion 24c.

In addition, the bent portion 24a or part of the trace pattern 24 is printed in a manner such that the squeezer 28 is moved in a direction generally perpendicular to the direction of the pattern.

At this time, patchy portions 29 (refer to FIG. 5) of the silver paste 27 are likely to occur at the bent portion 24a due to air bubbles or the like that are produced at the corners of ink-penetrating portions of the print mask 26 for forming the bent portion 24a.

As the electronic devices are reduced in size, it is required to reduce the size of the printed circuit board. This has lead to a narrower spacing between the trace patterns 24 and a smaller pattern width thereof, which has in turn presented the possibility of causing a break in a narrowed bent portion 24a due to the presence of a patchy portion 29 or the like.

The prior-art printed circuit board is provided with the trace pattern 24 having the same pattern reduced in width at both the bent portion 24a and the trace portion 24b. This presents a problem of causing a break at the bent portion 24a due to the presence of a patchy portion 29 or the like upon forming the trace pattern 24 by printing.

SUMMARY OF THE INVENTION

It is therefore an object of the present invention to provide a highly reliable printed circuit board that provides reduced breaks at the bent portion of the trace pattern.

As first means for solving the aforementioned problems, the present invention provides a printed circuit board which comprises an insulating substrate and a trace pattern formed by means of screen-printing on the insulating substrate and provided with a bent portion and trace portions connected thereto. The printed circuit board is adapted that the pattern width of the bent portion is wider than that of the trace portions located near both sides of the bent portion.

As second means, the present invention provides the printed circuit board adapted that the trace pattern is formed by means of screen-printing in such a direction as to firstly form the trace portions connected to the bent portion and thereafter to form the bent portion by printing.

Furthermore, as third means, the present invention provides the printed circuit board with the insulating substrate comprising a curved portion and cable portions connected to both ends of the curved portion. The insulating substrate is provided with a plurality of the trace patterns, with the width of the curved portion made wider than that of the cable portion and the bent portion located at the curved portion as well as the trace portion located at the cable portion.

Furthermore, as fourth means, the present invention provides the printed circuit board adapted that a connecting portion having the shape of a straight pattern is provided at one end of the trace portion connected to the bent portion, and the trace pattern is formed by means of screen-printing along the longitudinal direction of the straight pattern.

DETAILED DESCRIPTION OF THE PREFERRED EMBODIMENTS

Figure 1:
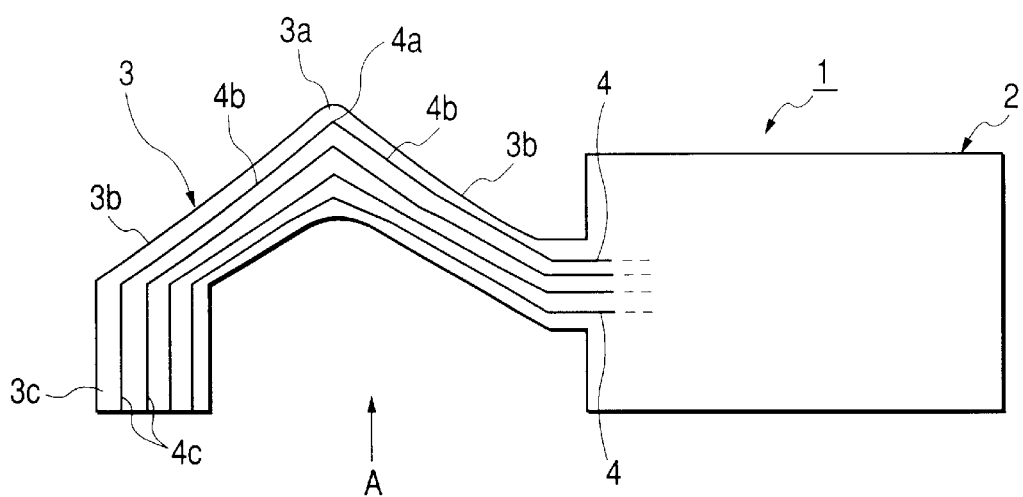
FIG. 1 is an overall plan view illustrating a printed circuit board according to the present invention.
Figure 2:
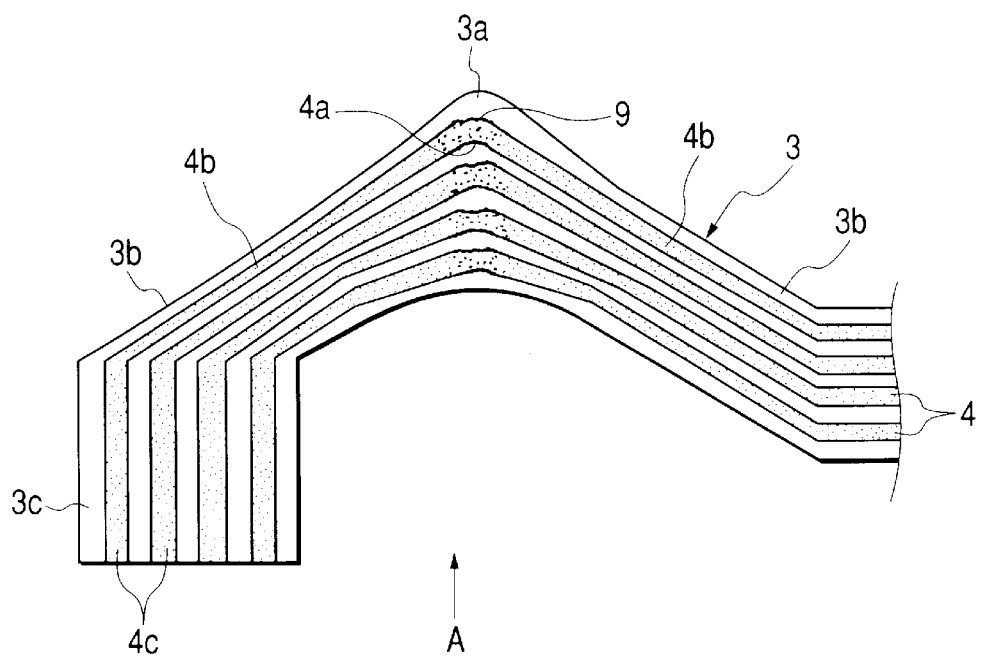
FIG. 2 is an enlarged plan view illustrating the main portion of the printed circuit board according to the present invention.
Figure 3:
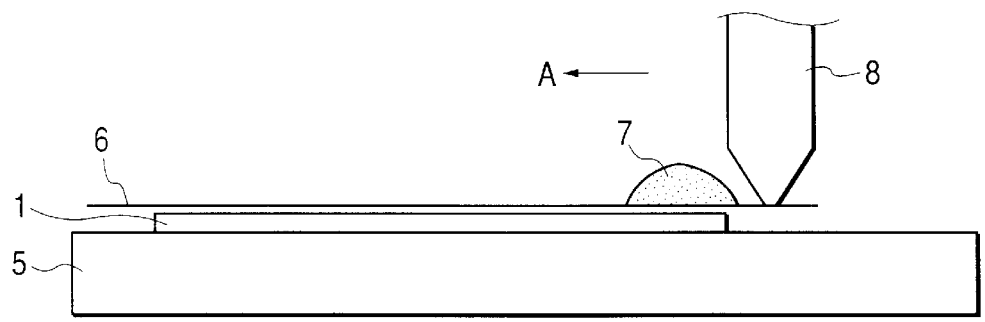
FIG. 3 is an explanatory view illustrating a method for fabricating the printed circuit board according to the present invention.
Figure 4:
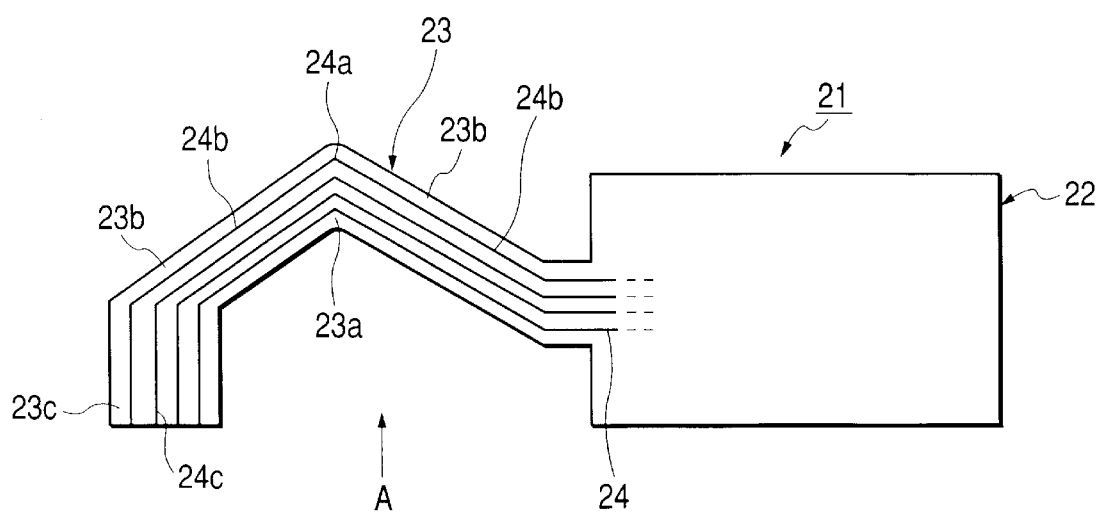
FIG. 4 is an overall plan view illustrating a prior-art printed circuit board.
Figure 5:
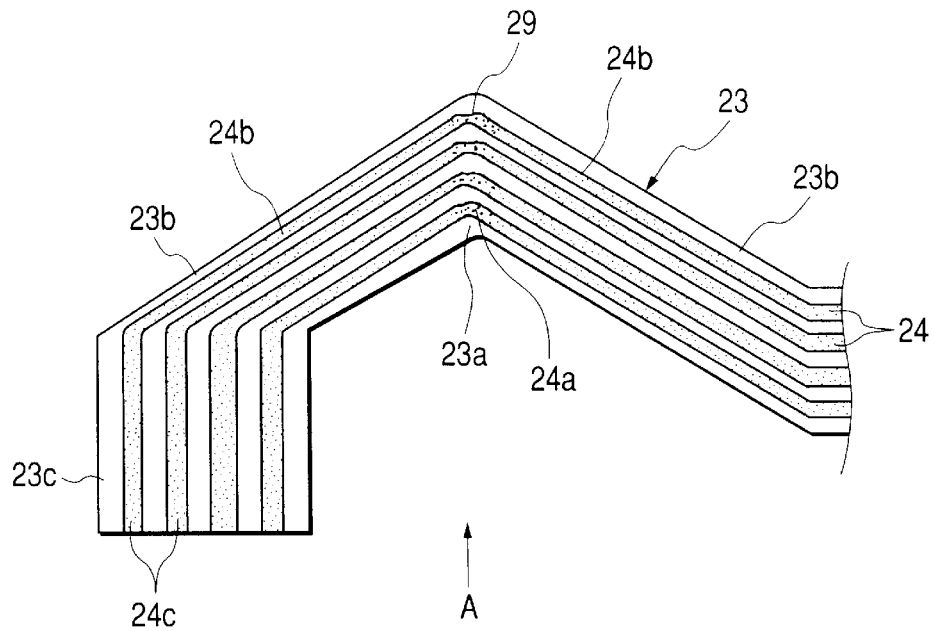
FIG. 5 is an enlarged plan view illustrating the main portion of the prior-art printed circuit board.
Figure 6:
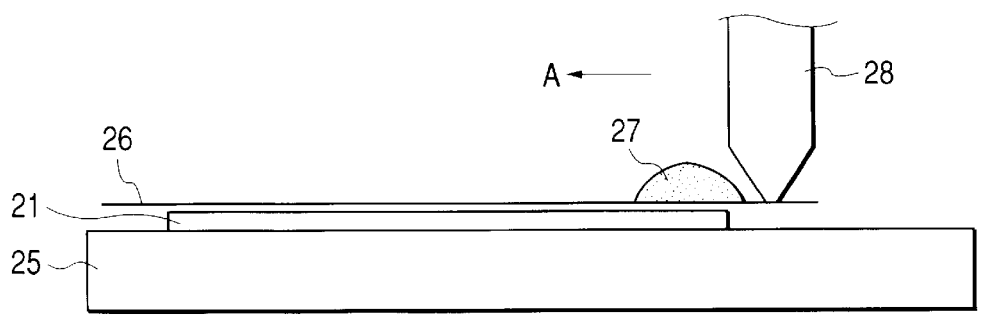
FIG. 6 is an explanatory view illustrating a method for fabricating the prior-art printed circuit board.

Now, the present invention will be explained below with reference to the accompanying drawings. FIG. 1 is an overall plan view illustrating a printed circuit board according to the present invention. FIG. 2 is an enlarged plan view illustrating the main portion of the printed circuit board according to the present invention. FIG. 3 is an explanatory view illustrating a method for fabricating the printed circuit board according to the present invention.

The structure of the printed circuit board according to the present invention is described with reference to FIGS. 1 and 2. In the figures, an insulating board 1 formed of a flexible material as a rectangular base portion 2 comprising stationary contacts (not shown in any figures) and a leading portion 3 formed generally in the shape of a letter "L" in its entirety.

The leading portion 3 may be formed generally in the shape of a letter "L" in order to avoid contacting with electric parts (not showing any figures) provided in the electric device, mounting members (not shown in any figures) or the like. The leading portion 3 is provided with a wide curved portion 3a bent in the shape of a letter "L"; cable portions 3b which are narrower in width than the curved portion 3a, connected to both sides of the curved portion 3a, and formed in the shape of a straight stripe; and a delivery portion 3c provided at an end of the cable portion 3b.

A plurality of wide trace patterns 4 formed of silver each may have a wide bent portion 4a bent in the shape of a letter "L", straight trace portion 4b connected to both ends of the bent portion 4a and narrower in pattern width than the bent portion 4a, and a straight connecting portion 4c provided at an end of the trace portion 4b.

That is, the bent portion 4a is wider in pattern width than the trace portions 4b that are located near both ends of the bent portion 4a.

The trace patterns 4 are formed on the leading portion 3 by screen-printing in the same process in parallel to each other, with the bent portion 4a disposed at the curved portion 3a of the leading portion 3 of the insulating board 1, the trace portion 4b disposed at the cable portion 3b and the base portion 2, and the connecting portion 4c disposed at the delivery portion 3c, respectively.

The trace portion 4b formed on the base portion 2 is connected to the stationary contacts (not shown in any figures) formed on the base portion 2 as an electrically conductive pattern.

The printed circuit board fabricated as such allows the connecting portion 4c provided at the delivery portion 3c to be connected with a connector (not shown in any figures), being adapted that an external current flows into the printed circuit board through the connecting portion 4c or a current from the printed circuit board is delivered outwardly through the connecting portion 4c.

To this end, the connecting portion 4c is a critical one and therefore a high accuracy is required of the screen-printing at the connecting portion 4c.

The connecting portion 4c is formed linearly as an electrically conductive pattern so that the connecting portion 4c is connected to or disconnected from the connector in the longitudinal direction thereof.

A method for fabricating a printed circuit board according to the present invention by means of screen-printing is implemented as shown in FIG. 3. That is, the insulating board 1 is placed and held on a mounting stage 5, and thereafter a meshed print mask 6 is placed on the insulating board 1.

Then, silver paste 7 is applied to the print mask 6, and thereafter a squeezer 8 is moved in the direction indicated by arrow A to form a plurality of trace patterns 4 by printing on the insulating board 1.

That is, in FIGS. 1 and 2, the squeezer 8 is to move along the arrow A.

At this time, the connecting portion 4c is first formed by means of printing, then the trace portions 4b are printed, and thereafter the bent portion 4a is formed by means of printing.

On the other hand, at the time of this printing, the delivery portion 3c of the leading portion 3 is located closer to the initial position of the squeezer 8. In addition to this, the connecting portion 4c or part of the trace pattern 4, formed in the shape of a straight pattern, is printed in a manner such that the squeezer 8 is to move in the direction of this straight pattern or along the longitudinal direction (the direction of the straight line) of the connecting portion 4c.

As described above, the squeezer 8 is moved in the direction of the straight pattern. This makes it possible to considerably reduce patchy portions of the silver paste 7 and thereby provide highly accurate printing at the connecting portion 4c.

In addition, the bent portion 4a or part of the trace pattern 4 is printed in a manner such that the squeezer 8 is moved in a direction generally perpendicular to the direction of the pattern after the trace portions 4b have been printed.

At this time, patchy portions 9 (refer to FIG. 2) of the silver paste 7 are likely to occur at the bent portion 4a due to air bubbles or the like that are produced at the corners of ink-penetrating portions of the print mask 6 for forming the bent portion 4a.

As the electronic devices are reduced in size, it is required to reduce the size of the printed circuit board. This has lead to a narrower spacing between the trace patterns 4 and a smaller pattern width thereof.

However, the bent portion 4a where patchy portions 9 or the like may occur is wider in pattern width. This allows a more area to remain on the bent portion 4a than on the prior-art bent portion and thereby provides a highly reliable trace pattern without causing a break thereon even when a patchy portion 9 or the like occurs at the bent portion 4a.

Incidentally, in the printed circuit board according to the aforementioned embodiment, the trace pattern except for the connecting portions being connected to the outside such as the connecting portion 4c may be coated with an insulating resist layer.

The trace patterns according to the present invention may contain silver or a substance that is mixed with carbon to such an extent that the electrical conductivity of the trace pattern is not impaired.

Furthermore, the present invention has been explained with reference to the insulating substrate that comprises the base portion 2 and the stripe-shaped leading portion 3. However, the insulating substrate may be, in its entirety, square or rectangular in shape, or formed of only a stripe-shaped leading portion.

Still furthermore, the cable portion 3b may not be straight but stripe-shaped.

As described above, the printed circuit board according to the present invention provides the trace patterns 4 with the bent portion 4a that is wider in pattern width than the trace portions 4b located near both ends of the bent portion 4a. This allows a more area to remain on the bent portion 4a than on the prior-art bent portion and thereby provides a highly reliable trace pattern without causing a break thereon even when a patchy portion 9 or the like is produced by printing at the bent portion 4a.

Furthermore, the trace patterns 4 are formed by means of screen-printing in a direction so as to firstly form the trace portions 4b connected to the bent portion 4a and then form the bent portion 4a, thereby allowing the pattern of the bent portion 4a to be formed following the pattern formation of the trace portions 4b. This allows the silver paste 7 to smoothly flow into the side of the bent portion 4a upon printing the trace portion 4b. It is thus made possible to provide the bent portion 4a with reduced patchy portions 9 or the like and thereby the trace patterns with reduced breaks thereon.

Furthermore, the insulating board 1 comprises the curved portion 3a and the cable portions 3b connected to both ends of the curved portion 3a. The insulating board 1 is provided with a plurality of trace patterns 4 with the curved portion 3a formed wider in width than the cable portion 3b, the bent portion 4a located at the curved portion 3a, and the trace portion 4b located at the cable portion 3b. This makes it possible to provide an insulating board 1 increased in area partially at the curved portion 3a without impairing the reduction thereof in size.

The connecting portion 4c formed in the shape of a straight pattern is also provided at one end of the trace portion 4b connected to the bent portion 4a, and the trace patterns 4 are formed by means of screen-printing in the direction of the straight pattern (longitudinal direction). This allows the longitudinal direction of the pattern of the connecting portion 4c to align with the direction of printing at the particularly critical connecting portion 4c. This allows the paste to flow smoothly and thus reduce patchy portions, smears or the like of the silver paste 7, thereby making it possible to provide highly accurate printing at the connecting portion 4c.

What is claimed is:

1. A printed circuit board comprising:

an insulating substrate; and a trace pattern formed by means of screen-printing on the insulating substrate and provided with a bent portion and trace portions connected to the bent portion, wherein the pattern width of said bent portion is wider than the pattern width of said trace portion located near both sides of said bent portion, and wherein said trace pattern is formed by means of screen-printing in a direction so as to firstly form said trace portions connected to said bent portion and thereafter form said bent portion by printing.

2. The printed circuit board according to claim 1, wherein said insulating substrate comprises a curved portion and cable portions connected to both ends of the curved portion, and is provided with a plurality of said trace patterns with the width of said curved portion made wider than the width of said cable portion and said bent portion located at said curved portion as well as said trace portion located at said cable portion.

3. The printed circuit board according to claim 2, wherein a connecting portion having a shape of a straight pattern is provided at one end of said trace portion connected to said bent portion, and said trace pattern is formed by means of screen-printing along a longitudinal direction of the straight pattern.

* * * * *